(12) United States Patent
Birman et al.

(10) Patent No.: US 9,312,813 B2
(45) Date of Patent: Apr. 12, 2016

(54) INSTRUMENT PANEL CLUSTER

(71) Applicant: Continental Automotive Systems, Inc., Auburn Hills, MI (US)

(72) Inventors: Vyacheslav B. Birman, Auburn Hills, MI (US); Jeremy Rooney, Waterford, MI (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 238 days.

(21) Appl. No.: 14/101,394

(22) Filed: Dec. 10, 2013

(65) Prior Publication Data

US 2014/0165901 A1    Jun. 19, 2014

Related U.S. Application Data

(60) Provisional application No. 61/738,426, filed on Dec. 18, 2012.

(51) Int. Cl.
*G01D 11/28* (2006.01)
*G01D 13/02* (2006.01)
*H03B 28/00* (2006.01)

(52) U.S. Cl.
CPC ............ *H03B 28/00* (2013.01); *G01D 11/28* (2013.01); *G01D 13/02* (2013.01); *Y10T 29/49826* (2015.01)

(58) Field of Classification Search
CPC ....... G01D 11/28; G01D 13/02; G01D 13/04; B60K 35/00; B60Q 3/04; B60Q 3/042; B60Q 3/044

USPC .......... 116/286, 287, 288, 62.1, 62.4, DIG. 5, 116/DIG. 6, DIG. 36; 362/23.19, 23.2, 489, 362/628

See application file for complete search history.

(56) References Cited

U.S. PATENT DOCUMENTS

| | | | |
|---|---|---|---|
| 5,130,548 A * | 7/1992 | Sano ...................... | G01D 13/28 116/286 |
| 6,379,015 B2 | 4/2002 | Wilhelm et al. | |
| 7,394,399 B2 | 7/2008 | Aoki | |
| 7,426,864 B2 | 9/2008 | Cook | |
| 7,556,390 B2 | 7/2009 | Takato | |
| 7,629,874 B2 | 12/2009 | Araki et al. | |
| 7,665,413 B2 | 2/2010 | Birman et al. | |
| 7,677,744 B2 * | 3/2010 | Birman ................... | B60K 37/02 362/23.11 |
| 2009/0121853 A1 | 5/2009 | Eich et al. | |

FOREIGN PATENT DOCUMENTS

| | | | | | |
|---|---|---|---|---|---|
| FR | 2760414 A1 | * | 9/1998 | ............ | B60Q 3/044 |
| GB | 2015161 A | * | 9/1979 | ........... | G02B 6/2817 |
| JP | 2003237413 A | * | 8/2003 | ............. | B60K 35/00 |
| JP | 2004170115 A | * | 6/2004 | ............. | G01D 11/28 |
| JP | 2007309837 A | * | 11/2007 | ............. | G01D 11/28 |
| JP | 2009008488 A | * | 1/2009 | ............. | G01D 11/28 |
| JP | 2009145280 A | * | 7/2009 | ............. | G01D 13/04 |
| WO | 2009/120742 A1 | | 10/2009 | | |

* cited by examiner

*Primary Examiner* — R. A. Smith

(57) ABSTRACT

An instrument cluster assembly is disclosed and includes at least one gauge. The gauge comprises a dial surface and a ring spaced apart from the dial surface. The ring has an outer surface and an inner surface that includes ring graphics. The gauge further comprises a pointer rotatable about an axis. The pointer may include a pointer arm including a portion extending into a space defined between the inner surface of the ring and the dial surface and at least partially visible through the ring. The dial surface my include dial graphics.

17 Claims, 4 Drawing Sheets

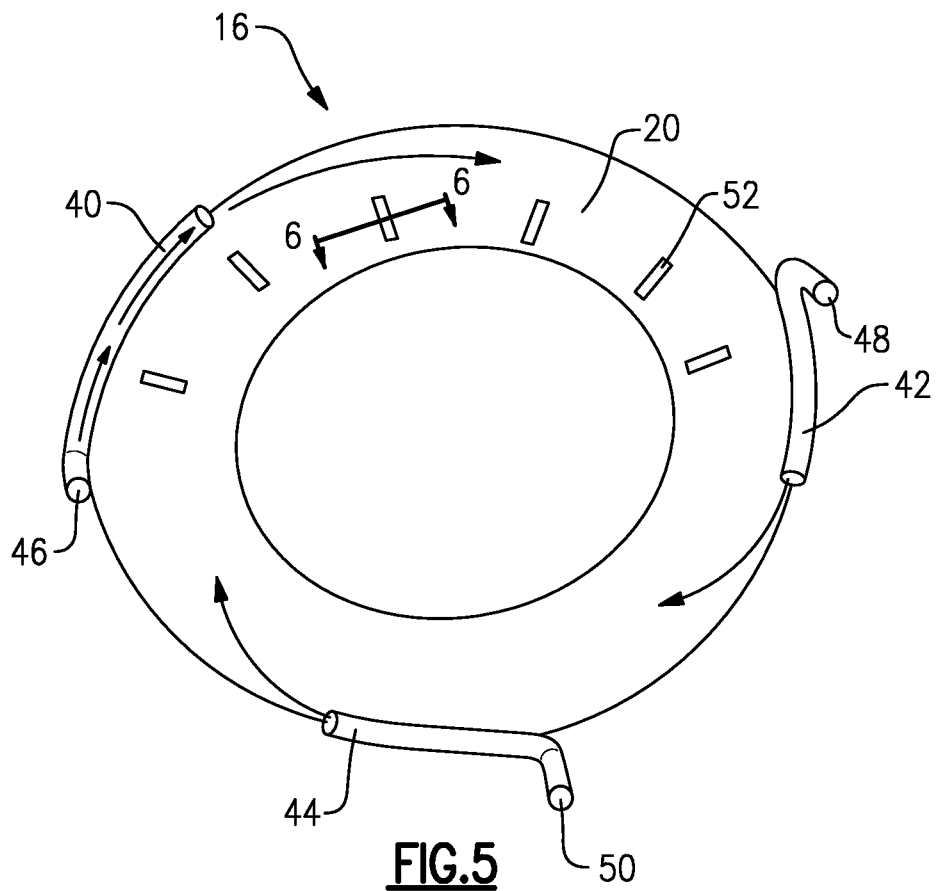
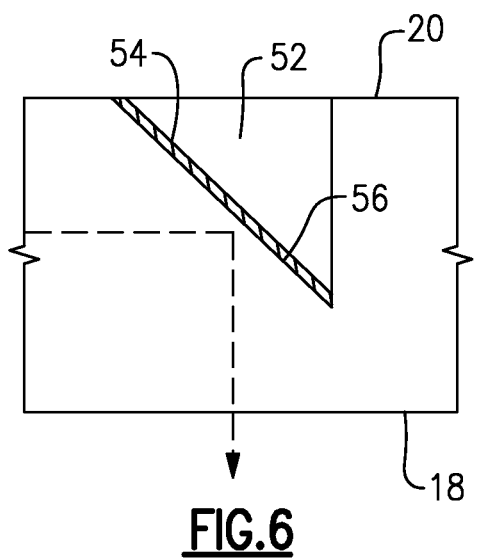

INSTRUMENT PANEL CLUSTER

CROSS REFERENCE TO RELATED APPLICATION

This application claims priority to U.S. Provisional Application No. 61/738,426 filed on Dec. 18, 2012.

BACKGROUND

The present disclosure is related generally to instrument clusters for vehicles.

Vehicles include instrument clusters and gauges for communicating desired operating parameters such as vehicle speed, engine rpm and direction indicators. Different methods and devices are known for communicating this information. Each method and device provides not only the function of communicating operating information to a driver, but also form and contribute to the style and aesthetic appearance of a vehicle interior. Accordingly, it is desirable to develop new and unique devices and methods for communicating and representing vehicle operating information to contribute to a desired appearance.

SUMMARY

An instrument cluster assembly includes at least one gauge. The gauge comprises a dial surface and a transparent ring spaced apart from the dial surface. The ring has an outer surface and an inner surface that includes ring graphics. The dial surface may also include dial graphics. The ring is configured to be illuminated.

As one example, the inner surface of the ring includes a diffractive film having the ring graphics. The diffractive film creates a three dimensional effect and may reduce parallax to the driver with respect to the film and dial graphics. Alternatively or additionally, the ring graphics may comprise indentations or ink on the inner surface of the ring.

The gauge further comprises a pointer rotatable about an axis. The pointer may include a pointer arm including a portion extending into a space defined between the inner surface of the ring and the dial surface. The portion is at least partially visible through the ring.

These and other features disclosed herein can be best understood from the following specification and drawings, the following of which is a brief description.

BRIEF DESCRIPTION OF THE DRAWINGS

FIG. 5 is a schematic view of an example illuminated ring.
FIG. 6 is a partial cross section of the illuminated ring of FIG. 5.

DETAILED DESCRIPTION

Figure 1:
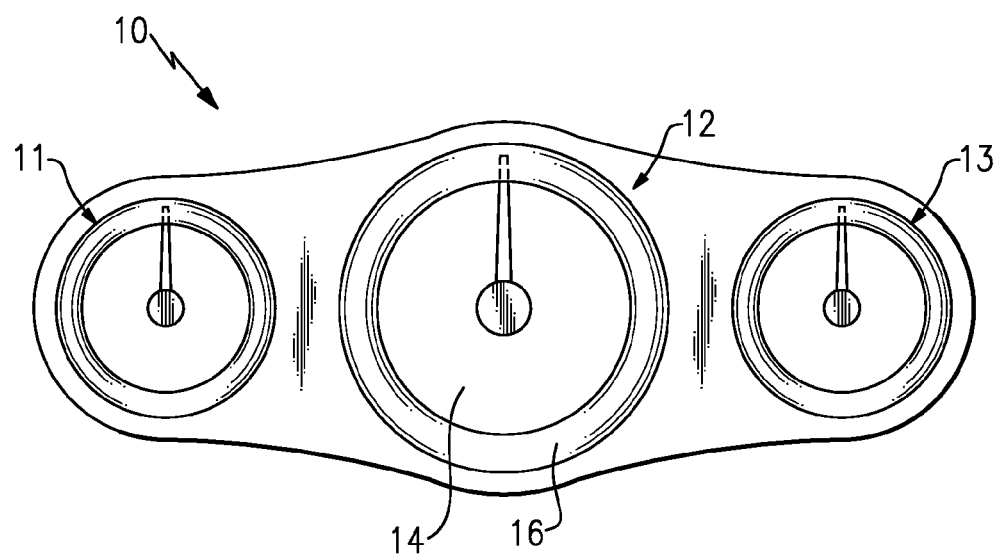
FIG. 1 is a front view of an example instrument cluster assembly.

Referring to FIG. 1, an example instrument cluster 10 includes a gauge 12 and secondary gauges 11 and 13. The example gauge 12 includes a dial surface 14 and a ring 16 spaced apart from the dial surface 14.

Figure 2:
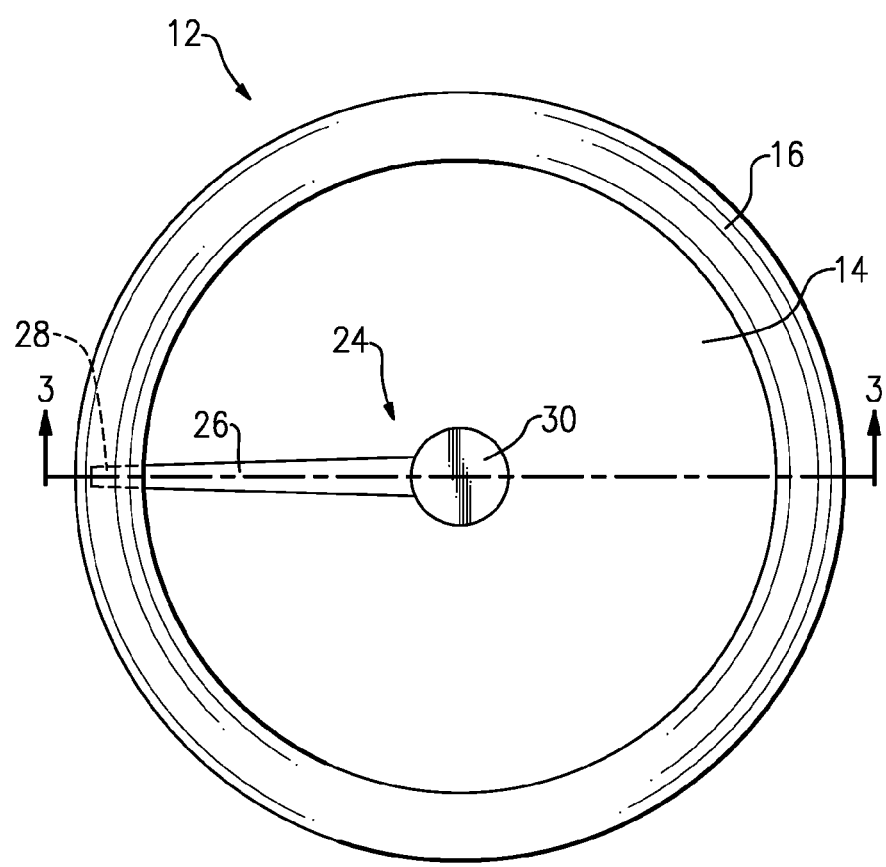
FIG. 2 is a front view of an example gauge.
Figure 3:
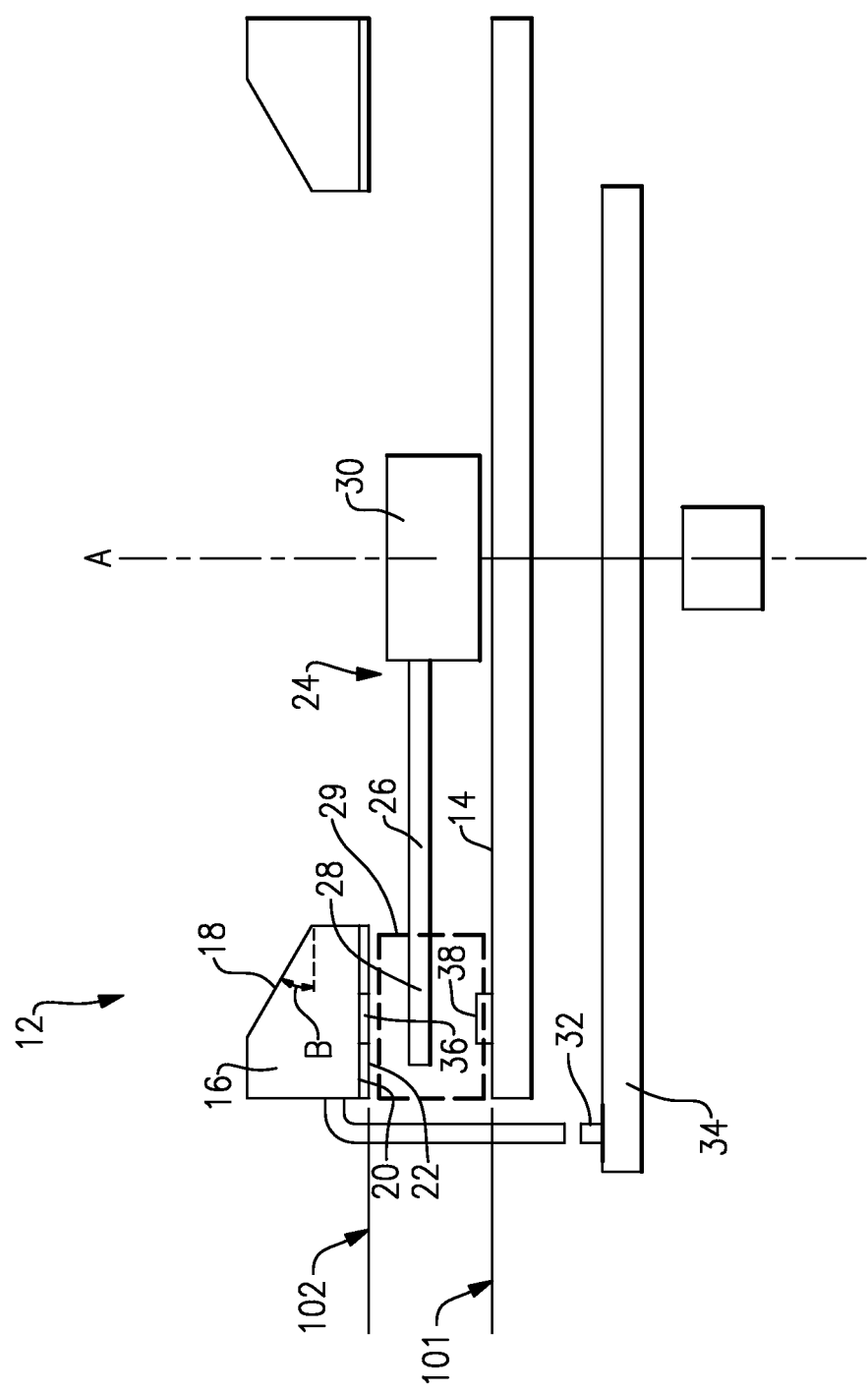
FIG. 3 is a cross-sectional view of the example gauge.

Referring to FIGS. 2 and 3 with continued reference to FIG. 1, the ring 16 includes an outer surface 18 and an inner surface 20. The inner surface 20 of the ring 16 is substantially parallel to the dial surface 14. The outer surface 18 is angled differently than the dial surface 14 and the inner surface 20. The outer surface 18 is disposed at an angle B, which provides an increased width of the ring 16 toward a radially outer side of the ring 16.

The ring 16 of the example gauge 12 is transparent and may comprise an acrylic material. The ring 16 is configured to be illuminated by a light source 32 in connection with a printed circuit board 34, as shown schematically in FIG. 3. The example ring 16 is separately illuminable from said dial surface 14.

The example ring 16 further includes ring graphics 36 on the inner surface 20. For example, the ring graphics 36 could be indicative of information, such as speed or rpm range. The dial surface 14 may include a set of dial graphics 38. Thus, the example gauge 12 has at least two independent levels of graphics. In one example configuration, one of the ring graphics 36 and the dial graphics 38 may be indicative of miles per hour and the other indicative of kilometers per hour. The ring graphics 36 may be colored differently from the dial graphics 38.

The ring graphics 36 on the inner surface 20 may be part of a diffractive film 22. As another example, the graphics 36 may comprise ink on the inner surface 20.

The example gauge 12 further includes a pointer 24, which rotates about an axis A. The pointer 24 includes pointer arm 26. A portion 28 of the pointer arm 26 extends into the space 29 defined by the axial space between the inner ring surface 20 and the dial surface 14, as shown schematically in FIG. 3. The pointer arm 26 extends from a hub 30 disposed at an axis of rotation A, and the portion 28 is a tip at the distal end of the pointer arm 26 from the hub 30.

The dial graphics 38 are disposed within the space 29. The transparency of the ring 16 allows the portion 28 of the pointer arm 26 and the dial graphics 38 to be seen through the ring 16.

Figure 4:
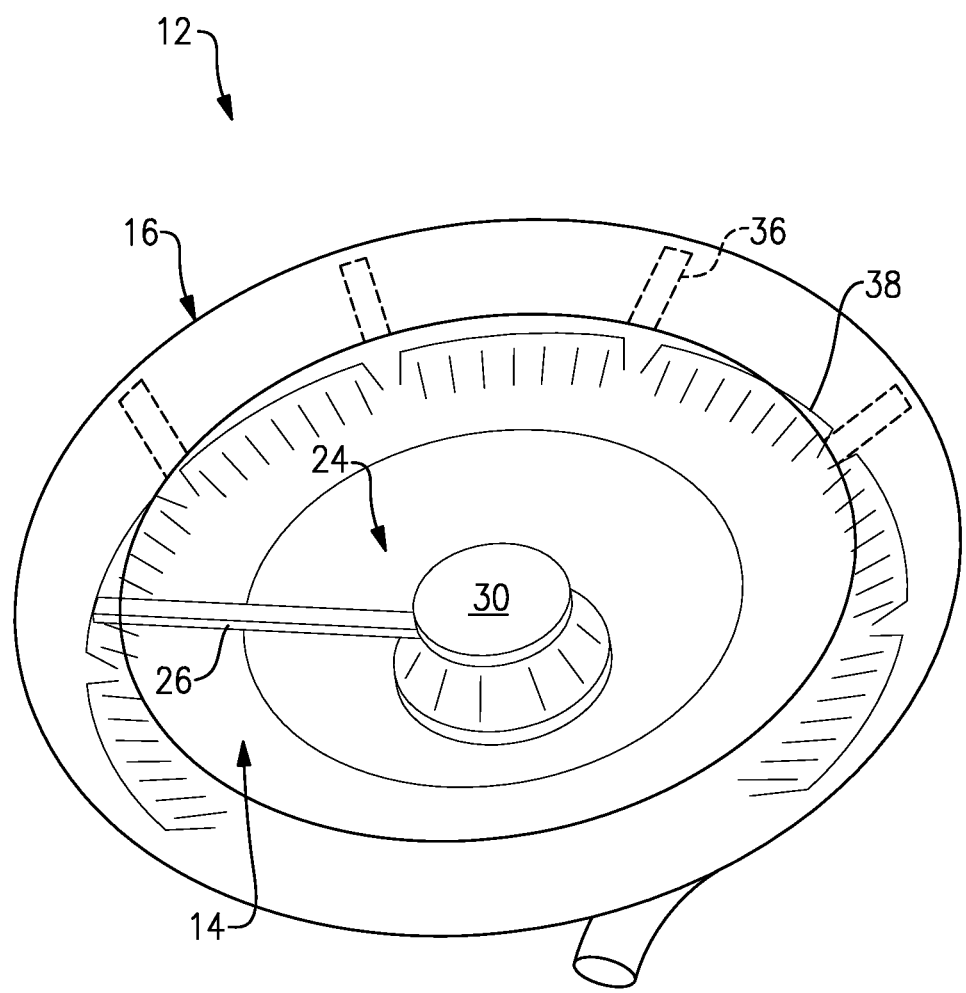
FIG. 4 is a perspective view of the example gauge.

In the example, the transparency of the ring 16 allows for graphics 36 and 38 to be displayed at different planes. In this example, the dial surface 14 is disposed within a first plane 101 and the inner ring surface 20 is disposed within a second plane 102 spaced apart from the first plane 101 in a direction toward a vehicle operator. Ring graphics 36 and dial graphics 38 are therefore both visible and disposed on different planes to provide a three dimensional visual appearance, as shown in FIGS. 3 and 4. Further, utilizing the diffractive film 22 on the inner surface 20 would reduce parallax to the vehicle operator with respect to the ring graphics 36 and the dial graphics 38.

FIG. 5 shows how the example ring 16 may be illuminated. Legs 40, 42, 44 extend from the ring 16 near its radially outer surface. Each leg 40, 42, 44 is in communication with a light source 46, 48, 50, as shown schematically. The legs 40, 42, and 44 are light guides for propagating light evenly throughout the ring 16, and are disposed circumferentially about the ring 16. FIG. 5 shows a view of the example ring's inner surface 20. From that view, the light propagates in a clockwise direction, as shown schematically. Therefore, from the view of the front of the gauge 12, the example light propagation is counterclockwise.

The example ring 16 of FIG. 5 is formed with a plurality of indentations 52 on the inner surface 20. The indentations 52 may be utilized in addition to the diffractive film 22. FIG. 6 shows a partial cross section at one of the indentations 52. The indentation 52 includes an angled indentation surface 56 for reflecting the circumferentially propagating light toward the outer surface 18 of the ring 16, as shown schematically. In the example, the angled indentation surface 56 is angled 45 degrees from the plane of the inner surface 20. The angled indentation surface 56 may comprise a diffractive material 54 for reflecting the light toward the outer surface 18.

The example instrument cluster assembly 10 includes a gauge 12 having the features described herein. One of ordinary skill would understand that the secondary gauges 11, 13 may also include the disclosed features. Further, an instrument cluster assembly could be utilized having more or less gauges than those shown in the FIG. 1 example.

Although an embodiment of this invention has been disclosed, a worker of ordinary skill in this art would recognize that certain modifications would come within the scope of this invention. For that reason, the following claims should be studied to determine the true scope and content of this invention.

We claim:

1. An instrument cluster assembly comprising:
   at least one gauge comprising
      a dial surface including dial graphics;
      a transparent ring spaced apart from said dial surface and configured to be illuminated, said ring having an outer surface and an inner surface positioned closer to said dial surface than said outer surface, wherein said inner surface includes ring graphics, wherein said inner surface includes a diffractive film, and said diffractive film includes said ring graphics.

2. The instrument cluster assembly as recited in claim 1, further comprising:
   a pointer rotatable about an axis, said pointer including a pointer arm including a first portion extending into a space defined between said inner surface and said dial surface and at least partially visible through said ring.

3. The instrument cluster assembly as recited in claim 2, wherein said pointer arm extends from a hub disposed at said axis of rotation, said hub and said first portion on the same side of said dial surface.

4. The instrument cluster assembly as recited in claim 1, wherein said inner surface is substantially parallel to said dial surface.

5. The instrument cluster assembly as recited in claim 1, wherein said dial surface includes dial graphics, and said diffractive film reduces parallax between said dial surface and said ring.

6. The instrument cluster assembly as recited in claim 1, further comprising at least one light source for illuminating said ring.

7. The instrument cluster assembly as recited in claim 1, wherein said transparent ring includes a plurality of indentations on said inner surface for reflecting light toward said outer surface.

8. The instrument cluster assembly as recited in claim 1, wherein said dial graphics comprise one of a miles per hour scale and a kilometers per hour scale, and said ring graphics comprise the other of said miles per hour scale and said kilometers per hour scale.

9. An instrument cluster assembly comprising:
   at least one gauge comprising
      a dial surface including dial graphics;
      a transparent ring spaced apart from said dial surface and configured to be illuminated, said rind having an outer surface and an inner surface positioned closer to said dial surface than said outer surface, wherein said inner surface includes ring graphics, wherein said ring includes a plurality of legs extending transverse from said ring for propagating light tangentially into the ring.

10. The instrument cluster assembly as recited in claim 9, wherein each of said plurality of legs are spaced circumferentially about said ring for uniformly propagating light into the ring.

11. A gauge comprising:
    a dial surface including dial graphics;
    a transparent ring spaced apart from said dial surface and configured to be illuminated, said ring having an outer surface and an inner surface positioned closer to said dial surface than said outer surface, wherein said inner surface includes ring graphics, wherein said ring includes a plurality of legs extending transverse from said ring for propagating light tangentially into the ring.

12. The gauge as recited in claim 11, further comprising:
    a pointer rotatable about an axis, said pointer including a pointer arm including a portion extending into a space defined between said inner surface and said dial surface and at least partially visible through said ring, wherein said pointer arm extends from a hub disposed at said axis of rotation, said hub and said portion on the same side of said dial surface.

13. The gauge as recited in claim 11, wherein each of said plurality of legs are spaced circumferentially about said ring for uniformly propagating light into the ring.

14. A gauge comprising:
    A dial surface including dial graphics;
    a transparent ring spaced apart from said dial surface and configured to be illuminated, said rind having an outer surface and an inner surface positioned closer to said dial surface than said outer surface, wherein said inner surface includes ring graphics, wherein said inner surface includes a diffractive film, and said diffractive film includes said ring graphics.

15. The gauge as recited in claim 14, further comprising:
    a pointer rotatable about an axis, said pointer including a pointer arm including a portion extending into a space defined between said inner surface and said dial surface and at least partially visible through said ring, wherein said pointer arm extends from a hub disposed at said axis of rotation, said hub and said portion on the same side of said dial surface.

16. A method for making a gauge comprising:
    providing a dial surface having dial graphics;
    mounting a transparent ring spaced apart from said dial surface;
    providing ring graphics to an inner surface of said ring, wherein providing ring graphics comprises providing a diffractive film to said inner surface, said diffractive film including said ring graphics; and
    mounting at least one light source for illuminating said ring.

17. The method as recited in claim 16, further comprising:
    mounting a pointer; said pointer including a portion extending into a space defined between said dial surface and an inner surface of said ring.

\* \* \* \* \*